United States Patent
Zhou

(10) Patent No.: US 10,615,181 B2
(45) Date of Patent: Apr. 7, 2020

(54) ARRAY SUBSTRATE, DISPLAY PANEL, MANUFACTURING METHOD, AND DISPLAY DEVICE

(71) Applicants: BOE Technology Group Co., Ltd., Beijing (CN); Hefei Xinsheng Optoelectronics Technology Co., Ltd., Hefei (CN)

(72) Inventor: Jideng Zhou, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 26 days.

(21) Appl. No.: 15/781,933

(22) PCT Filed: Aug. 29, 2017

(86) PCT No.: PCT/CN2017/099387
§ 371 (c)(1),
(2) Date: Jun. 6, 2018

(87) PCT Pub. No.: WO2018/041081
PCT Pub. Date: Mar. 8, 2018

(65) Prior Publication Data
US 2018/0366492 A1 Dec. 20, 2018

(30) Foreign Application Priority Data

Aug. 31, 2016 (CN) .......................... 2016 1 0799410

(51) Int. Cl.
*H01L 27/12* (2006.01)
*G02F 1/1343* (2006.01)
(Continued)

(52) U.S. Cl.
CPC ...... *H01L 27/124* (2013.01); *G02F 1/134309* (2013.01); *G02F 1/136213* (2013.01);
(Continued)

(58) Field of Classification Search
CPC . H01L 27/124; H01L 27/1218; H01L 27/127; H01L 27/1255; G02F 1/134309;
(Continued)

(56) References Cited

U.S. PATENT DOCUMENTS

2004/0246409 A1* 12/2004 Jeon ................. G02F 1/136213
349/110
2006/0047975 A1 3/2006 Beukema et al.
(Continued)

FOREIGN PATENT DOCUMENTS

| CN | 1743933 A | 3/2006 |
| CN | 1837901 A | 9/2006 |

(Continued)

OTHER PUBLICATIONS

Apr. 12, 2019—(CN) Second Office Action Appn 201610799410.6 with English Translation.
(Continued)

*Primary Examiner* — Tong-Ho Kim
(74) *Attorney, Agent, or Firm* — Banner & Witcoff, Ltd.

(57) ABSTRACT

An array substrate, a display panel and a manufacturing method thereof, and a display device are disclosed. The array substrate includes a base substrate and a plurality of pixel units which are arrayed on the base substrate; the pixel unit includes a bottom electrode for storage capacitance and a pixel electrode, the pixel electrode and the bottom electrode for storage capacitance are electrically insulated from each other so as to form a storage capacitor; the pixel electrode and the bottom electrode for storage capacitance in the pixel unit are at least partially overlapped with each other
(Continued)

in a first direction so as to form the storage capacitance of the pixel unit, in which the first direction is parallel to the base substrate.

20 Claims, 6 Drawing Sheets

(51) Int. Cl.
*G02F 1/1362* (2006.01)
*G02F 1/1335* (2006.01)

(52) U.S. Cl.
CPC ........ *H01L 27/127* (2013.01); *H01L 27/1218* (2013.01); *H01L 27/1248* (2013.01); *H01L 27/1255* (2013.01); *G02F 1/133512* (2013.01); *G02F 1/133514* (2013.01); *G02F 1/136286* (2013.01); *G02F 2201/123* (2013.01); *G02F 2201/40* (2013.01)

(58) Field of Classification Search
CPC ......... G02F 1/136213; G02F 1/133512; G02F 1/133514; G02F 1/136286; G02F 2201/123; G02F 2201/40
USPC .......................................................... 257/72
See application file for complete search history.

(56) References Cited

U.S. PATENT DOCUMENTS

| 2008/0278666 | A1* | 11/2008 | Tsuchimichi | ..... G02F 1/133555 349/114 |
| 2014/0340603 | A1* | 11/2014 | Hu | .................... G02F 1/136227 349/43 |

FOREIGN PATENT DOCUMENTS

| CN | 101825814 A | | 9/2010 |
| CN | 102096254 A | | 6/2011 |
| CN | 106125436 A | | 11/2016 |
| JP | H07270819 A | | 10/1995 |
| JP | H09160074 A | | 6/1997 |
| JP | 2000171827 A | | 6/2000 |
| JP | 2004361977 A | * | 12/2004 |
| JP | 2004361977 A | | 12/2004 |

OTHER PUBLICATIONS

Nov. 30, 2017—(WO) International Search Report and Written Opinion Appn PCT/CN2017/099387 with English Translation.

\* cited by examiner

ARRAY SUBSTRATE, DISPLAY PANEL, MANUFACTURING METHOD, AND DISPLAY DEVICE

The application is a U.S. National Phase Entry of International Application No. PCT/CN2017/099387 filed on Aug. 29, 2017, designating the United States of America and claiming priority to Chinese Patent Application No. 201610799410.6, filed on Aug. 31, 2016. The present application claims priority to and the benefit of the above-identified applications and the above-identified applications are incorporated by reference herein in their entirety.

TECHNICAL FIELD

Embodiments of the present disclosure relate to an array substrate, a display panel and a manufacturing method thereof, and a display device.

BACKGROUND

With the development of thin film transistors (TFTs) of liquid crystal displays (LCDs), requirements on transmittance of a display panel are increasing for considerations such as power consumption and visual effect. Generally, there are mainly two factors affecting the transmittance of the display panel; the first factor is such a factor related to materials, mainly transmittances of materials of a polarizer material, a liquid crystal material or a color filter film material (for example, color filters with red, green and blue color); in a case that the materials are determined, an aperture ratio of a display pixel can also affect the transmittance of the display panel.

SUMMARY

At least one embodiment of the present disclosure provides an array substrate, the array substrate comprises a base substrate and a plurality of pixel units which are arrayed on the base substrate; the pixel unit comprises a bottom electrode for storage capacitance and a pixel electrode, and the pixel electrode and the bottom electrode for storage capacitance are electrically insulated from each other so as to form a storage capacitor; the pixel electrode and the bottom electrode for storage capacitance in the pixel unit are at least partially overlapped with each other in a first direction so as to form the storage capacitor of the pixel unit, in which the first direction is parallel to the base substrate.

For example, in the array substrate provided by at least one embodiment of the present disclosure, a thickness of the bottom electrode for storage capacitance in a direction perpendicular to the base substrate is larger than a maximum value of a width of the bottom electrode for storage capacitance in the first direction.

For example, in the array substrate provided by at least one embodiment of the present disclosure, the thickness of the bottom electrode for storage capacitance in the direction perpendicular to the base substrate is equal to 2-4 times of the maximum value of the width of the bottom electrode for storage capacitance in the first direction.

For example, in the array substrate provided by at least one embodiment of the present disclosure, the thickness of the bottom electrode for storage capacitance in the direction perpendicular to the base substrate is 1-5 microns.

For example, the array substrate provided by at least one embodiment of the present disclosure further comprises a data line and a gate line, which are arranged on the base substrate and intersected with each other, in which the first direction is parallel to the gate line or the data line.

For example, in the array substrate provided by at least one embodiment of the present disclosure, the first direction is parallel to the gate line; and the pixel electrode and the bottom electrode for storage capacitance in the pixel unit are at least partially overlapped with each other in a second direction, in which the second direction is parallel to the array substrate and is further parallel to the data line.

For example, in the array substrate provided by at least one embodiment of the present disclosure, an extension direction of the bottom electrode for storage capacitance is parallel to the base substrate, and the bottom electrode for storage capacitance is configured to surround a side surface, which is perpendicular to the base substrate, of the pixel electrode.

For example, in the array substrate provided by at least one embodiment of the present disclosure, the bottom electrode for storage capacitance comprises a first sub-electrode extending along the first direction and a second sub-electrode extending along the second direction.

For example, in the array substrate provided by at least one embodiment of the present disclosure, the bottom electrode for storage capacitance further comprises a connection sub-electrode for electrically connecting the first sub-electrode and the second sub-electrode.

For example, in the array substrate provided by at least one embodiment of the present disclosure, an orthographic projection of the bottom electrode for storage capacitance on a plane where the base substrate locates and an orthographic projection of the pixel electrode on the plane where the base substrate locates is not overlapped with each other.

For example, in the array substrate provided by at least one embodiment of the present disclosure, an overlapping area of orthographic projections of the bottom electrode for storage capacitance and the pixel electrode on a first plane is a first overlapping area, and an overlapping area of orthographic projections of the bottom electrode for storage capacitance and the pixel electrode on a second plane is a second overlapping area; a sum of the first overlapping area and second overlapping area is larger than or equal to an overlapping area predetermined threshold; and the first plane is perpendicular to the plane where the base substrate locates and is parallel to the data line, and the second plane is perpendicular to the plane where the base substrate locates and is parallel to the gate line.

For example, the array substrate provided by at least one embodiment of the present disclosure further comprises an insulation layer, in which the insulation layer in the pixel unit comprises a concave structure; the pixel electrode comprises a first portion, which locates at a side of the concave structure away from the bottom electrode for storage capacitance, a second portion, which locates at a side of the concave structure closer to the bottom electrode for storage capacitance, and a third portion, which at least partially overlaps the concave structure; and the first portion and the second portion locates at a side of the insulation layer away from the base substrate.

For example, in the array substrate provided by at least one embodiment of the present disclosure, the insulation layer is disposed between the base substrate and a plane where the first portion of the pixel electrode locates in the direction perpendicular to the base substrate.

For example, in the array substrate provided by at least one embodiment of the present disclosure, the pixel electrode and the base substrate are in direct contact via the concave structure.

For example, in the array substrate provided by at least one embodiment of the present disclosure, a material of the bottom electrode for storage capacitance is an organic material.

At least one embodiment of the present disclosure further provides a display panel; the display panel comprises the array substrate provided by any one of the embodiments of the present disclosure.

For example, the display panel provided by at least one embodiment of the present disclosure further comprises an opposite substrate, a black matrix, and a color filter. The black matrix is opposite to the bottom electrode for storage capacitance in the array substrate; the color filter is opposite to the pixel electrode in the array substrate; the black matrix and the color filter are disposed in the opposite substrate or the array substrate.

At least one embodiment of the present disclosure further provides a display device; the display device comprises the array substrate provided by any one of the embodiments of the present disclosure or comprises the display panel provided by any one of the embodiments of the present disclosure.

At least one embodiment of the present disclosure further provides a manufacturing method for an array substrate, the manufacturing method for the array substrate comprises: providing a base substrate; forming an insulation layer and a bottom electrode for storage capacitance on the base substrate; forming a concave structure for pixel electrode in the insulation layer, in which the concave structure for pixel electrode and the bottom electrode for storage capacitance are at least partially overlapped in a first direction, and the first direction is parallel to the base substrate; and forming a pixel electrode, in which the pixel electrode overlaps the concave structure for pixel electrode.

For example, in the manufacturing method for the array substrate provided by at least one embodiment of the present disclosure, forming of the insulation layer and the bottom electrode for storage capacitance on the base substrate comprises: forming a first insulation layer on the base substrate; forming a concave structure for bottom electrode in the first insulation layer; and forming the bottom electrode for storage capacitance in the concave structure for bottom electrode.

For example, in the manufacturing method for the array substrate provided by at least one embodiment of the present disclosure, after the bottom electrode for storage capacitance is formed and before forming the concave structure for pixel electrode, the manufacturing method further comprises: sequentially forming a protective layer and a second insulation layer on the bottom electrode for storage capacitance.

For example, in the manufacturing method for the array substrate provided by at least one embodiment of the present disclosure, forming of the concave structure for pixel electrode in the insulation layer comprises forming the concave structure for pixel electrode in the first insulation layer, the protective layer and the second insulation layer.

For example, the manufacturing method for the array substrate provided by at least one embodiment of the present disclosure further comprises: forming a gate line and a data line.

For example, in the manufacturing method for the array substrate provided by at least one embodiment of the present disclosure, the first direction is parallel to the gate line or the data line.

BRIEF DESCRIPTION OF THE DRAWINGS

FIG. 1b is a cross-sectional view taken along line AA' of the array substrate illustrated in FIG. 1a;
FIG. 1c is an exemplary diagram illustrating a principle to form a storage capacitor between a pixel electrode and a bottom electrode for storage capacitance of the array substrate illustrated in FIG. 1a;
FIG. 2b is a cross-sectional view taken along line AA' of the array substrate illustrated in FIG. 2a;
FIG. 2c is an exemplary diagram illustrating a principle to form a storage capacitor between a pixel electrode and a bottom electrode for storage capacitance of the array substrate illustrated in FIG. 2a.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The inventor have noted that factors which affect the aperture ratio of a pixel normally include the width of a bottom electrode for storage capacitance on an array substrate and the width of a black matrix (for example, the black matrix can be arranged on an opposite substrate), and in the following, reasons that the width of the bottom electrode for storage capacitance affects the aperture ratio of the display panel is described in detail with reference to FIG. 1a and FIG. 1b.

Figure 1A:
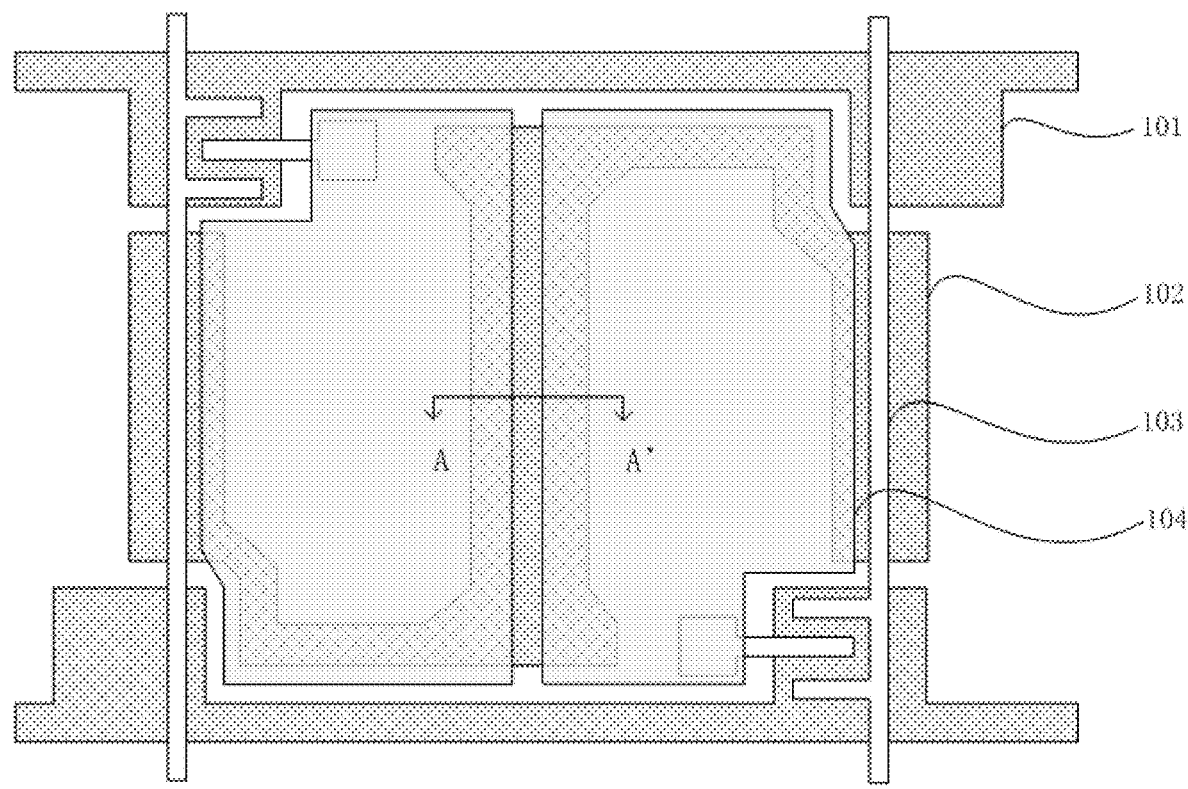
FIG. 1a is a plan view of an array substrate.
Figure 1B:
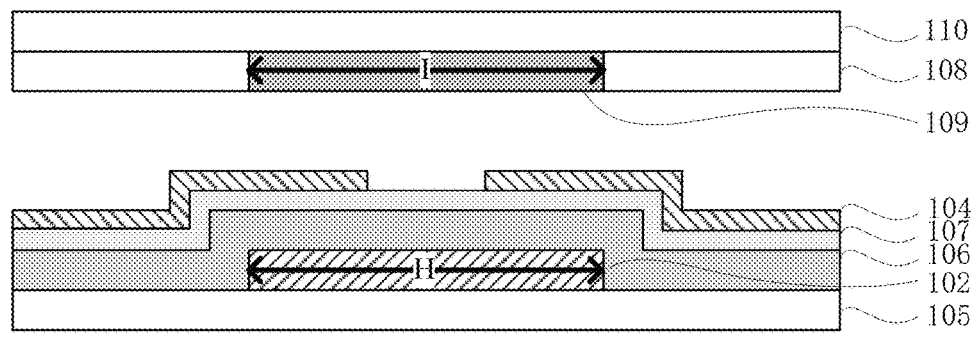

For example, FIG. 1a and FIG. 1b are plan view and cross-sectional view of a display panel. The cross-sectional view illustrated in FIG. 1b is obtained through sectioning along line AA' of the display panel illustrated in FIG. 1a. With reference to FIG. 1a, an array substrate can include a bottom electrode for storage capacitance 102 and a pixel electrode 104. For example, the bottom electrode for storage capacitance 102 and the pixel electrode 104 can be at least partially overlapped with each other in a direction perpendicular to a first substrate 105. With reference to FIG. 1b, an opposite substrate can include a black matrix 109, and the black matrix 109 is opposite to the bottom electrode for storage capacitance 102, so as to shield the bottom electrode for storage capacitance 102.

For example, according to specific implementation demands, the display panel can further include a gate line 101, a data line 103, the first substrate 105, a protective layer 106 for the bottom electrode for storage capacitance which is disposed on the bottom electrode for storage capacitance 102, an insulation layer 107 disposed on the protective layer 106 of the bottom electrode for storage capacitance, a second substrate 110, and at least a structure in a color filter 108 corresponding to the pixel electrode 104.

Figure 1C:
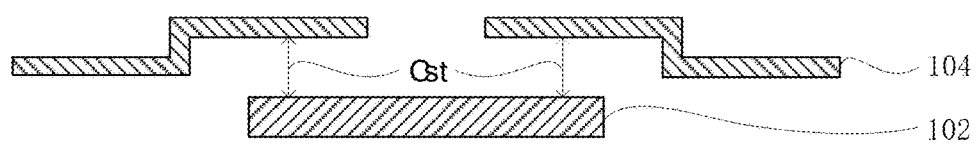

For example, as illustrated in FIG. 1b and FIG. 1c, the bottom electrode for storage capacitance 102 and the pixel electrode 104 are insulated from each other, such that a storage capacitor Cst is formed. For example, after a thin-film transistor is turned off, the storage capacitance Cst can keep the voltage on the pixel electrode 104 until the voltage signal of a next frame of image is written onto the pixel electrode 104 via the thin-film transistor which has been turned on.

With reference to FIG. 1c, the inventor have noted that the width H of the bottom electrode for storage capacitance 102 is normally large to ensure that the storage capacitance Cst is large enough (for example, capable of keeping the voltage signal of the current frame of image on the pixel electrode 104 before writing the voltage signal of the next frame of image into the pixel electrode 104 via thin-film transistor, which has been turned on), and therefore the width I of the black matrix on the opposite substrate is also relatively large, such that the aperture ratio of the pixel unit, which is defined by data lines and gate lines intersected with each other, is relatively small.

From the above, the inventor have noted that the width of the bottom electrode for storage capacitance is normally large to ensure that the display device illustrated in FIG. 1a and FIG. 1b to have storage capacitance Cst with large enough capacitance, which results in that the aperture ratio of the array substrate and the display panel including the above-mentioned pixel unit is relatively small.

Embodiments of the present disclosure provides an array substrate, a display panel and a manufacturing method thereof, and a display device, and the array substrate, the display panel and the manufacturing method thereof, and the display device realize improvement of the aperture ratio.

At least one embodiment of the present disclosure provides an array substrate, the array substrate comprises a base substrate and a plurality of pixel units which are arrayed on the base substrate; the pixel unit comprises a bottom electrode for storage capacitance and a pixel electrode, the pixel electrode and the bottom electrode for storage capacitance are electrically insulated from each other so as to form a storage capacitor; the pixel electrode and the bottom electrode for storage capacitance in the pixel unit are at least partially overlapped with each other in a first direction so as to form the storage capacitor of the pixel unit, in which the first direction is parallel to the base substrate.

At least one embodiment of the present disclosure further provides a display panel; the display panel comprises the array substrate provided by any one of the embodiments of the present disclosure.

At least one embodiment of the present disclosure further provides a display device; the display device comprises the array substrate provided by any one of the embodiments of the present disclosure or comprises the display panel provided by any one of the embodiments of the present disclosure.

At least one embodiment of the present disclosure further provides a manufacturing method for an array substrate, the manufacturing method for the array substrate comprises: providing a base substrate; forming an insulation layer and a bottom electrode for storage capacitance on the base substrate; forming a concave structure for pixel electrode in the insulation layer, wherein the concave structure for pixel electrode and the bottom electrode for storage capacitance are at least partially overlapped in a first direction, and the first direction is parallel to the base substrate; and forming a pixel electrode, wherein the pixel electrode overlaps the concave structure for pixel electrode.

Detail descriptions will be given to the array substrate, the display panel and the manufacturing method thereof, and the display device according to embodiments of the present disclosure with reference to a plurality of embodiments in the following.

First Embodiment

The present embodiment provides an array substrate, and the array substrate can used in a display panel and a display device. For example, as illustrated in FIG. 2, the array substrate can be implemented as an array substrate in double-gate structure; for another example, as illustrated in FIG. 2e and FIG. 2f, the array substrate also can be implemented as an array substrate in single-gate structure.

Figure 2A:
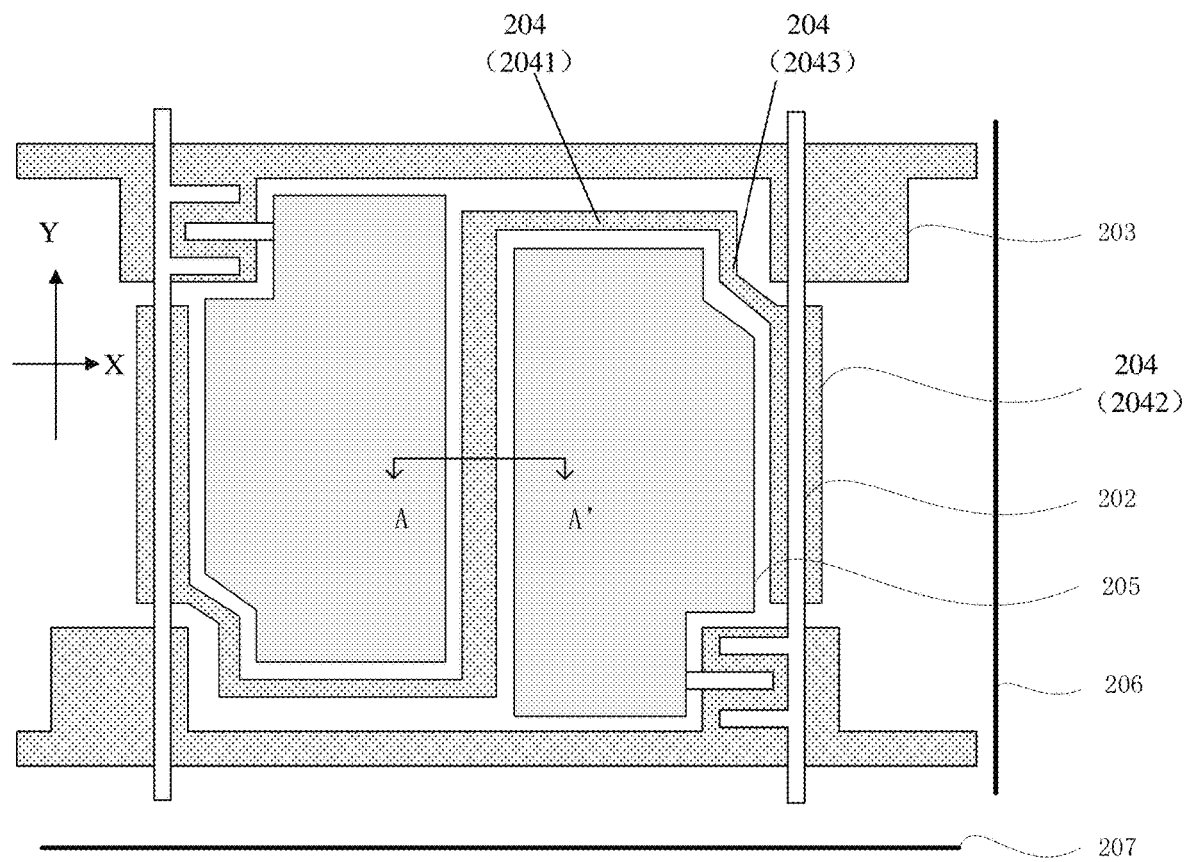
FIG. 2a is a plan view of an array substrate provided by an embodiment of the present disclosure.
Figure 2B:
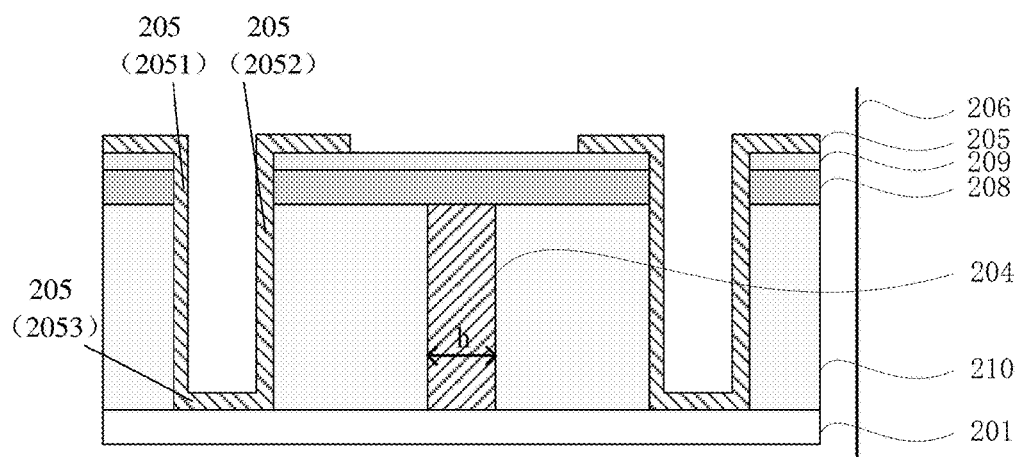

For example, FIG. 2a and FIG. 2b are plan view and cross-sectional view of a display panel provided by the first embodiment. The cross-sectional view illustrated in FIG. 2b is obtained through sectioning along line AA' of the display panel illustrated in FIG. 2a.

For example, as illustrated in FIG. 2a and FIG. 2b, the array substrate can include the base substrate 201 and a plurality of pixel units which are arrayed on the base substrate 201; the pixel unit (for example, the pixel unit) includes a bottom electrode for storage capacitance 204 and a pixel electrode 205. For example, the base substrate 201 can be a glass substrate, a quartz substrate, a plastic substrate (for example, a polyethylene terephthalate (PET) substrate), or a substrate made of another suitable material. For example, the bottom electrode for storage capacitance 204 can be formed of copper, aluminum, or aluminum alloy, but the embodiment of the present disclosure is not limited to this case. For example, the bottom electrode for storage capacitance 204 also can be formed of an organic material. For example, the pixel electrode 204 can be formed of a transparent conductive material; the transparent conductive material for example can be indium tin oxide (ITO) or indium zinc oxide (IZO).

For example, the pixel electrode 205 and the bottom electrode for storage capacitance 204 are electrically insulated from each other so as to form a storage capacitor. For example, the pixel electrode 205 and the bottom electrode for storage capacitance 204 in a pixel unit (for example, in at least one pixel unit) are at least partially overlapped with each other in a first direction so as to form the storage capacitor of the pixel unit, in which the first direction is parallel to the base substrate (for example, parallel to a gate line or a data line), that is, the first direction is within a plane parallel to a surface of the base substrate. Therefore, an orthographic projection of the pixel electrode 205 in the pixel unit on a plane perpendicular to the array substrate and an orthographic projection of the bottom electrode for storage capacitance 204 on the plane perpendicular to the array substrate are at least partially overlapped with each other.

For example, the array substrate can further include a data line 202 and a gate line 203; the data line 202 and the gate line 203 are intersects with each other and forming a pixel unit. For example, the first direction can be parallel to the gate line or the data line, but the embodiment of the present disclosure is not limited to this case. For example, as illustrated in FIG. 2a, in a case that the array substrate is an array substrate in double-gate structure, the pixel unit can include two sub-pixel unit, each sub-pixel unit can include one pixel electrode 205; for another example, as illustrated in FIG. 2e and FIG. 2f, in a case that the array substrate is an array substrate in single-gate structure, the pixel unit can include a single sub-pixel unit. For example, exemplary descriptions are given to a principle for increasing an aperture ratio of the array substrate provided by the embodiment of the present disclosure with reference to FIG. 2a-FIG. 2c in the following.

Figure 2C:
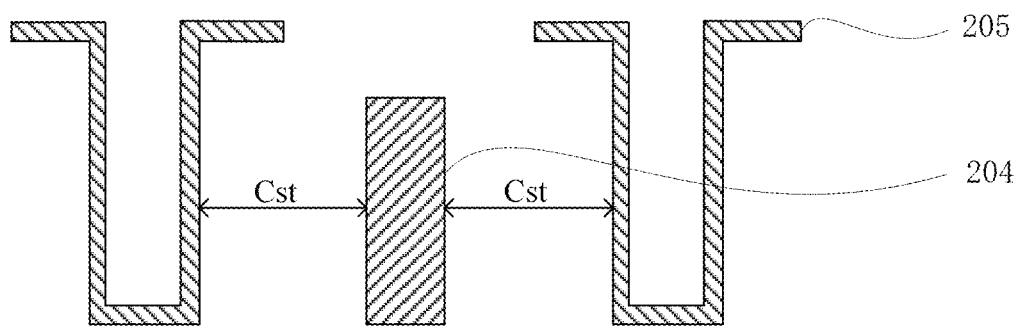

For example, as illustrated in FIG. 2a-FIG. 2c, the array substrate includes the bottom electrode for storage capacitance 204, a pixel electrode 205 in a sub-pixel locates on the left side of the pixel unit, and a pixel electrode 205 in a sub-pixel locates on the right side of the pixel unit. For example, as illustrated in FIG. 2a-FIG. 2c, the bottom electrode for storage capacitance 204 and the pixel electrode 205 in the sub-pixel locates on the left side of the pixel unit are at least partially overlapped with each other in the first direction (for example, an extension direction of the gate line 203), that is, orthographic projections of the pixel electrode 205 and the bottom electrode for storage capacitance 204 on a first plane 206 is partially overlapped with each other, in which the first plane 206 is perpendicular to the plane where the base substrate 201 locates and is parallel to the data line 202; for another example, the bottom electrode for storage capacitance 204 and the pixel electrode 205 in the sub-pixel locates on the right side of the pixel unit are at least partially overlapped with each other in the first direction.

For example, because the storage capacitor between the pixel electrode 205 and the bottom electrode for storage capacitance 204 illustrated in FIG. 2a-FIG. 2c is formed between a side surface of the pixel electrode 205 (that is, a surface that intersects the base substrate 201) and a side surface of the bottom electrode for storage capacitance 204 (that is, a surface that intersects the base substrate 201). Therefore, it's not necessary to increase the storage capacitance between the pixel electrode 205 and the bottom electrode for storage capacitance 204 through increasing the width h of the bottom electrode for storage capacitance 204, and the bottom electrode for storage capacitance 204 can be designed into a thick and narrow shape, such that the area of the black matrix can be reduced, and aperture ratios of the pixel unit and an array substrate including the pixel unit can be increased without affecting the performance characteristics of the storage capacitor.

For example, the thickness of the bottom electrode for storage capacitance in a direction perpendicular to the base substrate and the maximum value of the width of the bottom electrode for storage capacitance in the first direction (for example, parallel to an extension direction of the gate line or the data line) can be set according to specific implementation demands, and the embodiments of the present disclosure are not limited in this aspect. For example, the thickness of the bottom electrode for storage capacitance in the direction perpendicular to the base substrate is larger than the maximum value of the width of the bottom electrode for storage capacitance in the first direction. For example, the thickness of the bottom electrode for storage capacitance in the direction perpendicular to the base substrate is equal to two to four times (for example, three times) of the maximum value of the width of the bottom electrode for storage capacitance in the first direction. For example, in the array substrate provided by at least one embodiment of the present disclosure, the thickness of the bottom electrode for storage capacitance in the direction perpendicular to the base substrate is one-five microns (for example, two microns, three micronsor four microns).

For example, the width of the bottom electrode for storage capacitance 204 and the area of an orthographic projection of the bottom electrode for storage capacitance 204 on the base substrate 201 can be set according to specific implementation demands, and the embodiments of the present disclosure are not limited in this aspect. For example, the area of the orthographic projection of the bottom electrode for storage capacitance 204 on the base substrate 201 is smaller than a first predetermined threshold, and the first predetermined threshold is an area of an orthographic projection of the bottom electrode for storage capacitance, in a conventional array substrate, on a plane where the base substrate locates; that is, the width h of the bottom electrode for storage capacitance 204 illustrated in FIG. 2b is smaller than a second predetermined threshold, the second predetermined threshold is a predetermined width H of the bottom electrode for storage capacitance of the array substrate in the conventional display panel. For example, the predetermined width H of the bottom electrode for storage capacitance in conventional display panel is larger than or equal to 7 microns, and smaller than or equal to 8 microns. For example, the width h of the bottom electrode for storage capacitance 204 provided by the embodiment of the present disclosure can be 1-5 microns (for example, 1 micron, 2 microns, 3 microns or 4 microns), such that the aperture ratio of the array substrate provided by the embodiment of the present disclosure can be increased without affecting the performance characteristics of the storage capacitor.

For example, detail descriptions will be given to the array substrate in double-gate structure, which is provided by the embodiment of the present disclosure, with reference to FIG. 2a-FIG. 2c.

For example, as illustrated in FIG. 2a and FIG. 2b, the array substrate can further comprises an insulation layer (for example, a first insulation layer 210). For example, the first insulation layer 210 in the pixel unit can include a concave structure. For example, as illustrated in FIG. 2a and FIG. 2b, the pixel electrode in the pixel unit comprises a concave portion and the concave portion can include a first portion 2051, which locates at a side of the concave structure away from the bottom electrode for storage capacitance, a second portion 2052, which locates at a side of the concave structure closer to the bottom electrode for storage capacitance, and a third portion 2053, which at least partially overlaps the concave structure; the first portion and the second portion locates at a side of the insulation layer away from the base substrate. For example, the insulation layer (for example, the first insulation layer 210) can be disposed between the base substrate 201 and a plane where the first portion of the pixel electrode 205 locates in the direction perpendicular to the base substrate. For example, the pixel electrode 205 can be in direct contact with the base substrate 201 via the concave structure, but the embodiment of the present disclosure is not limited to this case.

For example, as illustrated in FIG. 2b, the first insulation layer 210 and the bottom electrode for storage capacitance 204 can be disposed in same one layer, such that the thickness of the array substrate can be minimized provided that the overlapping area between the bottom electrode for storage capacitance 204 and the pixel electrode 205 in the first direction is unchanged, but the embodiment of the present disclosure is not limited to this case. For another example, part of the first insulation layer 210 can further include a portion which is disposed over the bottom electrode for storage capacitance 204. For example, the first insulation layer 210 can be formed of the silicon oxide (SiOx), silicon oxynitride (SiNxOy), or silicon nitride (SiNx) or other suitable materials, but the embodiment of the present disclosure is not limited to this case.

For example, as illustrated in FIG. 2a and FIG. 2b, a storage capacitor Cst is formed by the side surface of the pixel electrode 205, the side surface of the bottom electrode for storage capacitance 204, and the first insulation layer 210 between the side surface of the pixel electrode 205 and the side surface of the bottom electrode for storage capacitance 204. For example, the distance between the bottom electrode for storage capacitance 204 and the pixel electrode 205 (for example, a distance in the first direction) or the thickness of the first insulation layer 210, between the bottom electrode for storage capacitance 204 and the pixel electrode 205, in the first direction can be set according to specific implementation demands, and the embodiments of the present disclosure are not limited in this aspect. For example, the smaller the distance between the bottom electrode for storage capacitance 204 and the pixel electrode 205 (or the smaller the thickness of the first insulation layer 210 in the first direction) is, the greater the storage capacitance 204 formed between the bottom electrode for storage capacitance 204 and the pixel electrode 205 can be obtained. For example, the distance between the bottom electrode for storage capacitance 204 and the pixel electrode 205 can be 0.5-2.5 microns (for example, 1 micron or 2 microns), but the embodiment of the present disclosure is not limited to this case.

For example, the relationship between an orthographic projection of the pixel electrode 205 (for example, a portion of the pixel electrode 205 disposed on the first insulation layer 210) on the base substrate 201 and an orthographic projection of the bottom electrode for storage capacitance 204 on the base substrate 201 can be set according to specific implementation demands, and the embodiments of the present disclosure are not limited in this aspect. For example, as illustrated in FIG. 2b, the orthographic projection of the bottom electrode for storage capacitance 204 on the plane where the base substrate 201 locates and the orthographic projection of the pixel electrode 205 on the plane where the base substrate 201 locates are not overlapped with each other, such that it's not necessary to provide an additional insulation layer between the bottom electrode for storage capacitance 204 and the pixel electrode 205 (in the direction perpendicular to the base substrate 201).

Figure 2D:
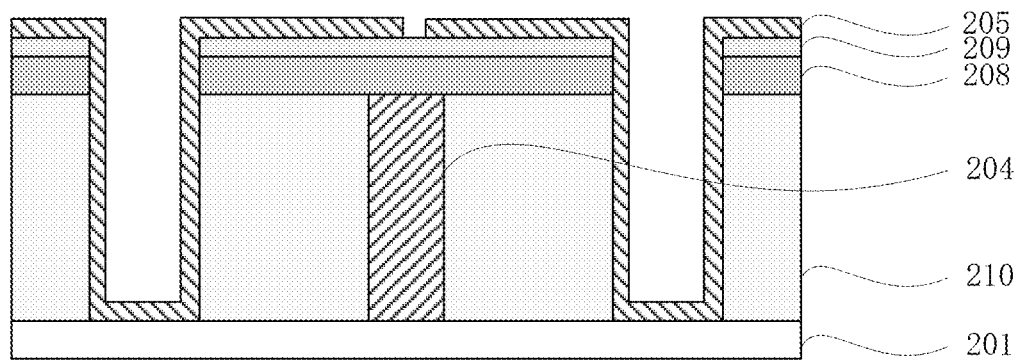
FIG. 2d is a structural diagram of another array substrate provided by an embodiment of the present disclosure.
Figure 2E:
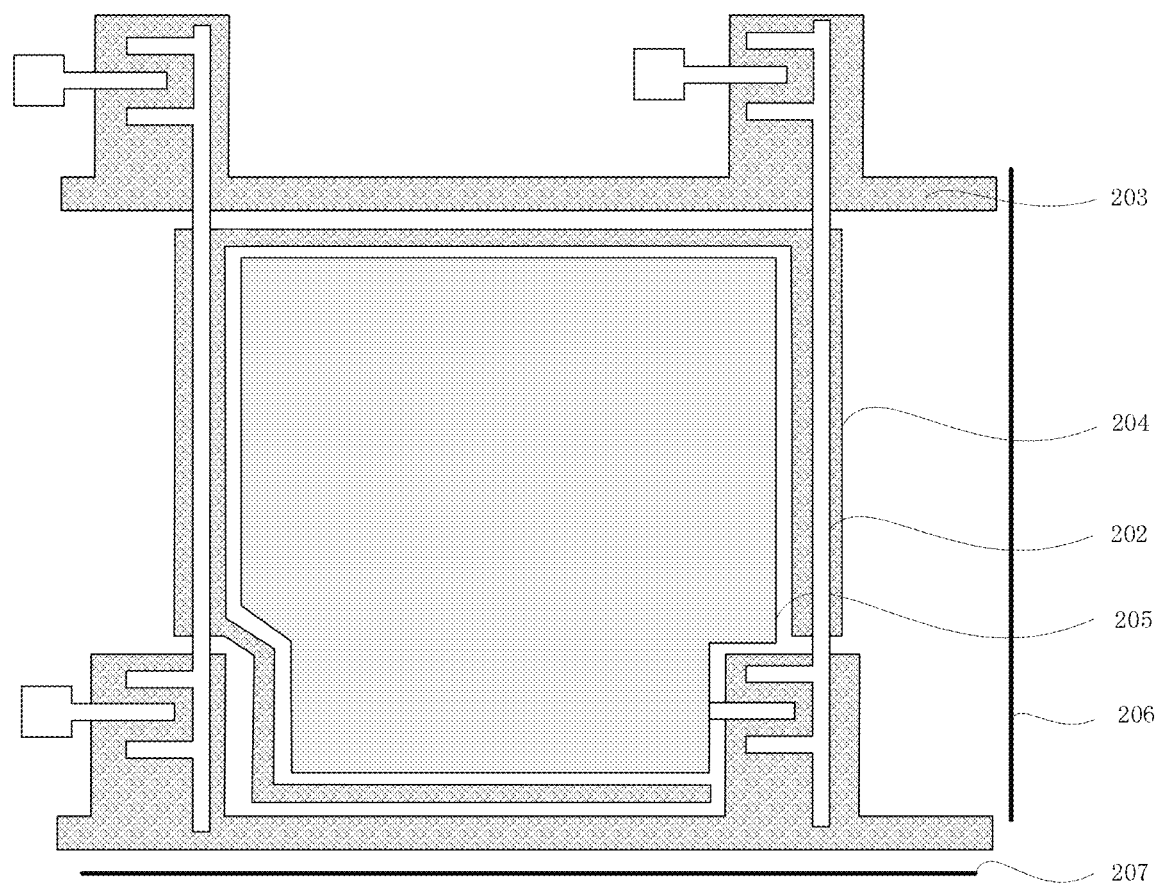
FIG. 2e is a structural diagram of further another array substrate provided by an embodiment of the present disclosure.
Figure 2F:
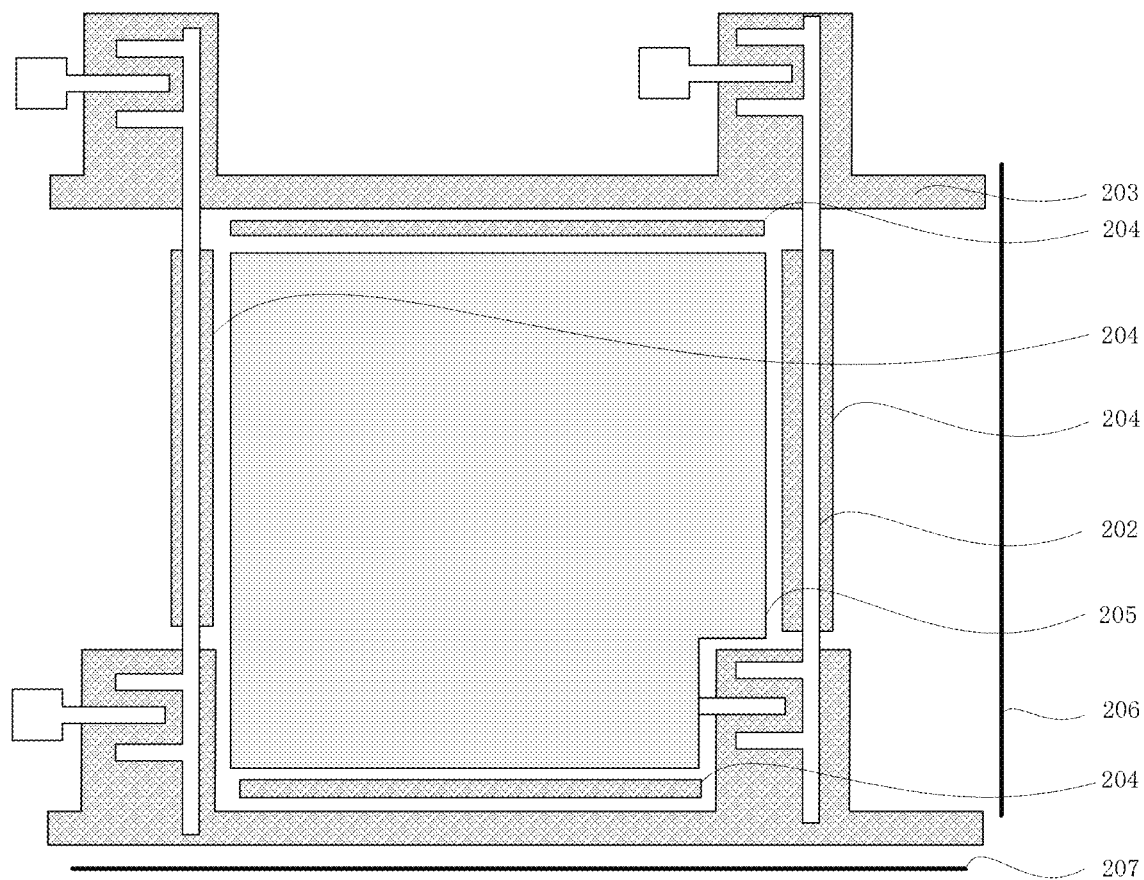
FIG. 2f is a structural diagram of still another array substrate provided by an embodiment of the present disclosure.

For another example, as illustrated in FIG. 2d, the array substrate can further comprise a protective layer 208 for the bottom electrode for storage capacitance and/or a second insulation layer 209, and the protective layer 208 for the bottom electrode for storage capacitance and the second insulation layer 209 for example can sequentially disposed on the base substrate 201 formed with the bottom electrode for storage capacitance 204 and the first insulation layer 210. In such a case, the orthographic projection of the bottom electrode for storage capacitance 204 on the plane where the base substrate 201 locates and the orthographic projection of the pixel electrode 205 on the plane where the base substrate 201 locates can be at least partially overlapped with each other, such that the storage capacitance Cst between the bottom electrode for storage capacitance 204 and the pixel electrode 205 can be increased.

For example, the protective layer 208 for the bottom electrode for storage capacitance and the second insulation layer 209 can be formed of the silicon oxide (SiOx), silicon oxynitride (SiNxOy), or silicon nitride (SiNx) or other suitable materials, but the embodiment of the present disclosure is not limited to this case. For example, in a case that the array substrate further includes the protective layer 208 for the bottom electrode for storage capacitance and/or the second insulation layer 209, the concave structure is also disposed in the protective layer 208 for the bottom electrode for storage capacitance and/or the second insulation layer 209, and the concave structure in the protective layer 208 for the bottom electrode for storage capacitance and/or the second insulation layer 209 corresponds to the concave structure in the first insulation layer 210; the concave structure in the protective layer 208 for the bottom electrode for storage capacitance and/or the second insulation layer 209 for example can be in consistence with the concave structure in the first insulation layer 210. For example, in a case that the array substrate further includes the protective layer 208 for the bottom electrode for storage capacitance and/or the second insulation layer 209, the insulation layer provided by the embodiment of the present disclosure further includes the protective layer 208 for the bottom electrode for storage capacitance and/or the second insulation layer 209.

For example, according to specific implementation demands, as illustrated in FIG. 2a, the pixel electrode 205 and the bottom electrode for storage capacitance 204 in the pixel unit can further be at least partially overlapped with each other in the second direction; the second direction is parallel to the array substrate and is different from the first direction; for example, the second direction is parallel to the data line 202; that is, orthographic projections of the pixel electrode 205 and the bottom electrode for storage capacitance 204 on a second plane 207 is partially overlapped with each other, in which the second plane 207 is perpendicular to the plane where the base substrate 201 locates and is parallel to the gate line 203, such that the storage capacitance Cst formed between the pixel electrode 205 and the bottom electrode for storage capacitance 204 can be increased.

For example, according to specific implementation demands, as illustrated in FIG. 2a, an extension direction of the bottom electrode for storage capacitance 204 is parallel to the base substrate; for example, the bottom electrode for storage capacitance 204 can surround the pixel electrode 205 (for example, surrounding a side surface, which is perpendicular to the base substrate, of the pixel electrode). For example, the bottom electrode for storage capacitance 204 can include a first sub-electrode 2041 extending along the first direction (X direction) and a second sub-electrode 2042 extending along the second direction (Y direction). For example, according to specific implementation demands, the bottom electrode for storage capacitance 204 can include a connection sub-electrode 2043 for electrically connecting the first sub-electrode 2041 and the second sub-electrode 2042. Therefore, the pixel electrode 205 and the bottom electrode for storage capacitance 204 can be at least partially overlapped with each other in the first direction, in the second direction and in other direction(s) parallel to the base substrate 201, such that the storage capacitance Cst formed between the pixel electrode 205 and the bottom electrode for storage capacitance 204 can be further increased.

For example, the overlapping area of orthographic projections of the pixel electrode 205 and the bottom electrode for storage capacitance 204 on the first plane 206 is a first overlapping area, and the overlapping area of orthographic projections of the pixel electrode 205 and the bottom electrode for storage capacitance 204 on the second plane 207 is a second overlapping area. For example, the specific values of the first overlapping area and the second overlapping area can be set according to specific implementation demands, and the embodiments of the present disclosure are not limited in this aspect. For example, according to the formula for calculating capacitance, in a case that the distance between two electrode plates of a plate capacitor is kept unchanged, the greater the overlap area of the two electrode plates in a direction perpendicular to the two electrode plates is, the greater the capacitance of the plate capacitor is obtained. Therefore, in a case that the distance between the pixel electrode and the bottom electrode for storage capacitance in the first direction and/or the second direction is unchanged, the storage capacitance formed between the pixel electrode and the bottom electrode for storage capacitance and the overlapping area of orthographic projections of the pixel electrode and the bottom electrode have a positive correlation.

For example, in a case that the pixel electrode and the bottom electrode for storage capacitance are at least partially overlapped with each other only in the first direction, the first overlapping area can be larger than or equal to an overlapping area predetermined threshold; the overlapping area predetermined threshold can satisfy the following requirement, that is, in a case than the overlapping area of orthographic projections of the pixel electrode and the bottom electrode is larger than or equal to the overlapping area predetermined threshold, the storage capacitance Cst formed between the pixel electrode and the bottom electrode for storage capacitance can keep the voltage on the pixel electrode 204 after a thin-film transistor is turned off and until the voltage signal of a next frame of image is written onto the pixel electrode 204 via the thin-film transistor, which is turned on. For another example, in a case that the pixel electrode and the bottom electrode for storage capacitance are at least partially overlapped with each other only in the second direction, the second overlapping area can be larger than or equal to an overlapping area predetermined threshold. For further another example, in a case that the pixel electrode and the bottom electrode for storage capacitance are at least partially overlapped with each other in the first direction and in the second direction, and the distance between the pixel electrode and the bottom electrode for storage capacitance in the first direction is equal to the distance between the pixel electrode and the bottom electrode for storage capacitance in the second direction, the sum of the first overlapping area and second overlapping area is larger than or equal to an overlapping area predetermined threshold.

For example, in a case that the distance between the pixel electrode and the bottom electrode for storage capacitance in the first direction is not equal to the distance between the pixel electrode and the bottom electrode for storage capacitance in the second direction, or the pixel electrode and the bottom electrode for storage capacitance are partially overlapped with each other in other direction(s) parallel to the base substrate, the concreate strutures of the pixel electrode and the bottom electrode for storage capacitance can be designed based on the overall storage capacitance Cst formed between the pixel electrode and the bottom electrode for storage capacitance and storage capacitance required by the pixel unit, but the embodiment of the present disclosure is not limited to this case.

For example, the array substrate provided by the embodiment of the present disclosure is not limited to the array substrate in double-gate structure illustrated in FIG. 2a and FIG. 2b. For example, the array substrate provided by the embodiment of the present disclosure also can be implemented as the array substrate in single-gate structure illustrated in FIG. 2e and FIG. 2f.

For example, as illustrated in FIG. 2f, the array substrate includes a plurality of pixel units defined by the data lines 202 and the gate lines 203, which are intersected with each other; the pixel unit includes one sub-pixel unit and one pixel electrode 205. For example, the bottom electrode for storage capacitance 204 illustrated in FIG. 2f can include the first sub-electrode extending along the first direction and/or the second sub-electrode extending along the second direction. Therefore, orthographic projections of the pixel electrode 205 and the bottom electrode for storage capacitance 204 on the first plane 206 can be partially overlapped, and/or orthographic projections of the pixel electrode 205 and the bottom electrode for storage capacitance 204 on the second plane 207 can be partially overlapped.

For another example, as illustrated in FIG. 2e, as compared to the array substrate illustrated in FIG. 2f, the array substrate illustrated in FIG. 2e can further include the connection sub-electrode for electrically connecting the first sub-electrode and the second sub-electrode. Therefore, the pixel electrode 205 and the bottom electrode for storage capacitance 204 can be at least partially overlapped with each other in the first direction, in the second direction and in other direction(s) parallel to the base substrate 201, such that the storage capacitance between the pixel electrode 205 and the bottom electrode for storage capacitance 204 can be further increased.

For example, in the present embodiment, the bottom electrode for storage capacitance can be designed into a thick and narrow shape by allowing the pixel electrode and the bottom electrode for storage capacitance to be at least partially overlapped with each other in the first direction, and therefore, the area of the black matrix can be reduced, and the aperture ratios of the pixel unit and the array substrate including the pixel unit can be increased without affecting the performance characteristics of the storage capacitance.

Second Embodiment

Figure 3:
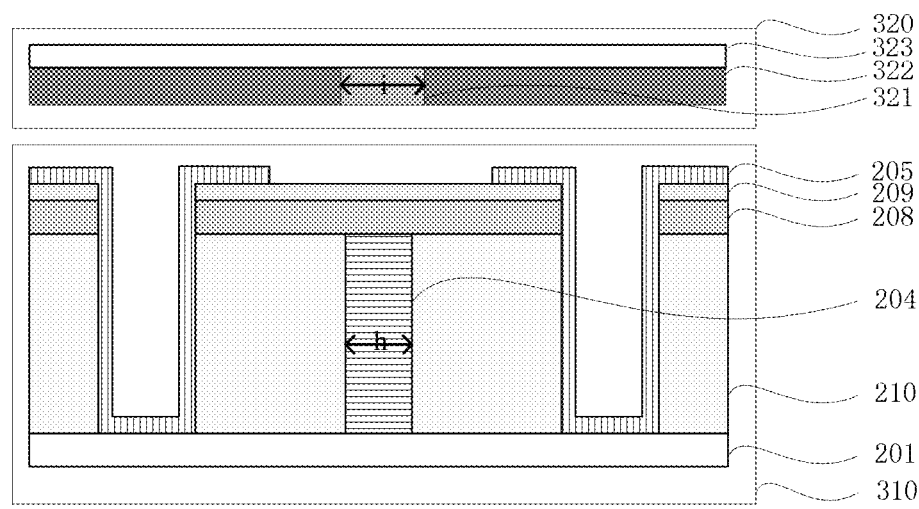
FIG. 3 is a structural diagram of a display panel provided by an embodiment of the present disclosure.

The present embodiment provides a display panel, the display panel can include any one of the array substrates (for example, the array substrate 310) provided by the first embodiment. For example, as illustrated in FIG. 3, the display panel can further include an opposite substrate 320, a black matrix 321 opposite to the bottom electrode for storage capacitance 204 in the array substrate, and a color filter 322 opposite to the pixel electrode 205 in the array substrate. For example, the black matrix and the color filter can disposed in the opposite substrate or in the array substrate according to actual requiments, and the embodiments of the present disclosure are not limited in this aspect. For example, as illustrated in FIG. 3, in a case that the black matrix and the color filter are disposed in the opposite substrate 320, the opposite substrate 320 can further include a second base substrate 323, in such a case, the opposite substrate 320 is described as a color filter substrate.

For example, the black matrix 321 and the bottom electrode for storage capacitance 204 are arranged oppositely, and the area of the orthographic projection of the bottom electrode for storage capacitance 204 on the base substrate 201 is smaller than the area of the orthographic projection of the bottom electrode for storage capacitance, in a conventional array substrate, on a plane of the base substrate 201. Therefore, the area of the orthographic projection of the black matrix 321 on the second base substrate 323 can be smaller than the area of the orthographic projection of conventional black matrix on the second base substrate 323, that is, the width i of the black matrix 321 can be smaller than the predetermined width I of the black matrix 109 of the opposite substrate in the conventional display panel.

For example, the present embodiment further provides a display panel, and as compared to the display panel illustrated in FIG. 3, the black matrix of the display panel is disposed on the array substrate instead of the opposite substrate.

Third Embodiment

At least one embodiment of the present disclosure further provides a display device, which includes any one of the array substrates provided by the first embodiment or any one of the display panels provided by the second embodiment. For example, the display device can be any products or device that has display function, such as a cell phone, a tablet computer, a television, a display screen, a laptop, a digital photo frame and a navigator. It should be noted that other indispensable components (such as a control device, an image data encoding/decoding device, a row scan driver, a column scan driver, a clock circuit or the like) can adopt convetional compoments, which should be understood by those skilled in the art, no further descriptions will be given herein and it should not be taken as a limitation on the embodiments of the present disclosure.

For example, in the present embodiment, the bottom electrode for storage capacitance can be designed into a thick and narrow shape by allowing the pixel electrode and the bottom electrode for storage capacitance to be at least partially overlapped with each other in the first direction, and therefore, the area of the black matrix can be reduced, and thus the aperture ratio of the display device can be increased without affecting the performance characteristics of the storage capacitance.

Fourth Embodiment

The embodiment of the present disclosure provides an manufacturing method for an array substrate, and for example, the manufacturing method for the array substrate can include the following steps.

Step S10: providing a base substrate.
Step S20: forming an insulation layer and a bottom electrode for storage capacitance on the base substrate.
Step S30: forming a concave structure for pixel electrode in the insulation layer.
Step S40: forming a pixel electrode.

For example, the pixel electrode and the bottom electrode for storage capacitance are insulated with each other so as to form a storage capacitor.

For example, the concave structure for pixel electrode and the bottom electrode for storage capacitance are at least partially overlapped in a first direction, and the pixel electrode overlaps the concave structure for pixel electrode, and therefore, the pixel electrode in the pixel unit and the bottom electrode for storage capacitance are at least partially overlapped with each other in the first direction. For example, the first direction is parallel to the base substrate.

For example, in the step S20, forming of the insulation layer and the bottom electrode for storage capacitance on the base substrate comprises: forming a first insulation layer on the base substrate; forming a concave structure for bottom electrode in the first insulation layer; and forming the bottom electrode for storage capacitance in the concave structure for bottom electrode.

For example, after the bottom electrode for storage capacitance is formed and before forming the concave structure for pixel electrode, the manufacturing method further comprising a step S50, that is, sequentially forming a protective layer and a second insulation layer on the bottom electrode for storage capacitance. For example, in such a case, forming of the concave structure for pixel electrode in the insulation layer includes forming the concave structure for pixel electrode in the first insulation layer, the protective layer and the second insulation layer.

For example, the manufacturing method for the array substrate can include the following steps.

Step S60: forming a gate line and a data line intersected with each other on the base substrate.

For example, the gate line and the data line can be sequentially formed on the base substrate through a patterning process. For example, the data line and the gate line formed in the step S30 can define the pixel unit. For example, the first direction can be parallel to the gate line or the data line, but the embodiment of the present disclosure is not limited to this case. For example, the first direction can be parallel to the gate line; for example, the pixel electrode and the bottom electrode for storage capacitance also can be at least partially overlapped with each other in the second direction, and the second direction for example can be parallel to the array substrate and the data line.

For example, the manufacturing method for the array substrate provided by the embodiment of the present disclosure can be executed by an order of step S60, step S10, step S20, step S50, step S30 and step S40, but the embodiment of the present disclosure is not limited to this case.

Figure 4:
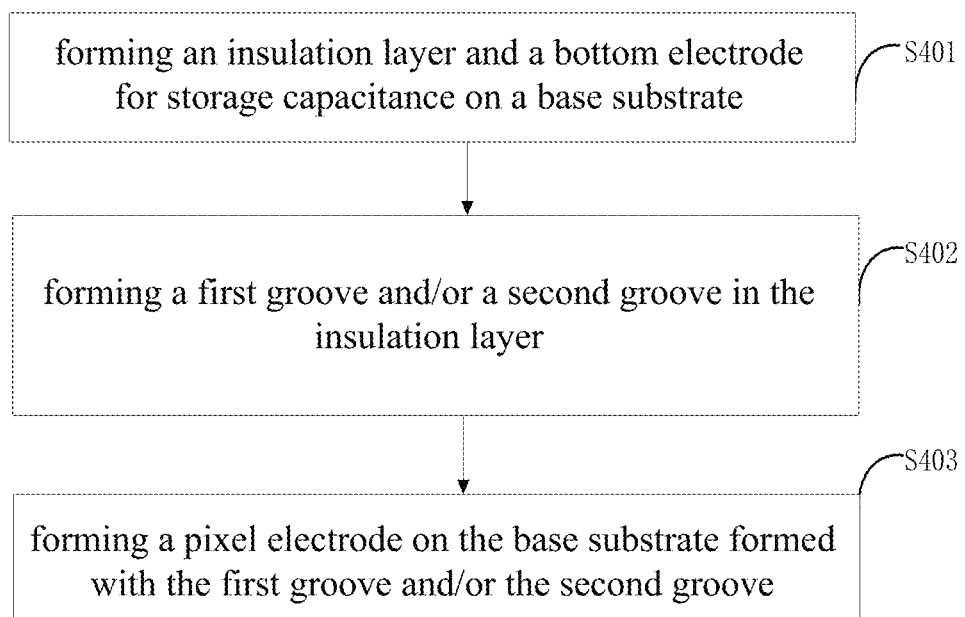
FIG. 4 is an exemplary flow chart of forming a pixel unit.

For example, FIG. 2 illustrates another manufacturing method for the array substrate provided by the embodiment of the present disclosure; as illustrated in FIG. 4, the manufacturing method for the array substrate includes the following steps.

Step S401: forming an insulation layer and a bottom electrode for storage capacitance on a base substrate.
Step S402: forming a first groove and/or a second groove in the insulation layer.
Step S403: forming a pixel electrode on the base substrate formed with the first groove and/or the second groove.

For example, in the step S401, the bottom electrode for storage capacitance can be formed through a patterning process, and the bottom electrode for storage capacitance for example can include a first sub-electrode extending along the first direction and a second sub-electrode extending along the second direction. For example, according to actual requirements, the bottom electrode for storage capacitance can further include a connection sub-electrode for electrically connecting the first sub-electrode and the second sub-electrode.

For example, in the step S402, the first groove and/or the second groove can be formed in the insulation layer through a patterning process. For example, the orthographic projection of the first groove and the bottom electrode for storage capacitance on the first plane are at least partially overlapped with each other, and the orthographic projectionare of the second groove and the bottom electrode for storage capacitance on the second plane are at least partially overlapped with each other, in which the first plane is perpendicular to the plane where the base substrate locates and is parallel to the data line, and the second plane is perpendicular to the plane where the base substrate locates and is parallel to the gate line.

For example, in the step S403, the pixel electrode can be formed on the base substrate formed with the first groove and/or the second groove through a patterning process.

For example, in the step S401, forming of the insulation layer and the bottom electrode for storage capacitance on the base substrate can include the following steps.

Step S101: forming the first insulation layer on the base substrate.

Step S102: forming a third groove in the first insulation layer (for example, through a patterning process).

Step S103: forming the bottom electrode for storage capacitance in the thrid groove (for example, through a patterning process).

For example, after the bottom electrode for storage capacitance is formed and before forming the first groove and/or the second groove, the manufacturing method further includes sequentially forming a protective layer and a second insulation layer on the bottom electrode for storage capacitance.

For example, forming of the first groove and/or the second groove in the insulation layer includes: foming the first groove and/or the second groove in the first insulation layer, the protective layer and the second insulation layer.

For example, the orthographic projection of the bottom electrode for storage capacitance on the plane where the base substrate locates and the orthographic projection of the pixel electrode on the plane where the base substrate locates are not overlapped with each other.

For example, the concrete structures of the bottom electrode for storage capacitance and the pixel electrode can refer to the array substrate provided by the first embodiment, and no further descriptions will be given herein.

From the above, embodiments of the present disclosure provides an array substrate, a display panel and a manufacturing method thereof, and a display device, the bottom electrode for storage capacitance can be designed into a thick and narrow shape by allowing the pixel electrode and the bottom electrode for storage capacitance to be at least partially overlapped with each other in the first direction, and therefore, the area of the black matrix can be reduced, and thus the aperture ratios of the pixel unit and the array substrate and display device including the pixel unit can be increased without affecting the performance characteristics of the storage capacitance.

It is apparent that the presented disclosure can be modified by those skilled in the art without departure from the spirit and scope of the disclosure, if the above modification of the presented disclosure belongs to the scope of the claims of the presented disclosure and its equivalent technologies, the presented disclosure is intended to include the above modifications.

The application claims priority to Chinese patent application No. 201610799410.6, filed on Aug. 31, 2016, the entire disclosure of which is incorporated herein by reference as part of the present application.

What is claimed is:

1. An array substrate, comprising: a base substrate and a pixel unit on the base substrate,
   wherein the pixel unit comprises a bottom electrode for storage capacitance and a pixel electrode, and the pixel electrode and the bottom electrode for storage capacitance are electrically insulated from each other so as to form a storage capacitor;
   the pixel electrode comprises a concave portion with respect to the base substrate, the concave portion is on a side of the bottom electrode for storage capacitance, the pixel electrode and the bottom electrode for storage capacitance in the pixel unit are at least partially overlapped with each other through the concave portion of the pixel electrode in a first direction so as to form the storage capacitor of the pixel unit, wherein the first direction is parallel to the base substrate;
   an overlapping area of orthographic projections of the bottom electrode for storage capacitance and the pixel electrode on a first plane is a first overlapping area;
   an overlapping area of orthographic projections of the bottom electrode for storage capacitance and the pixel electrode on a second plane is a second overlapping area;
   a sum of the first overlapping area and second overlapping area is larger than or equal to an overlapping area predetermine threshold; and
   the first plane is perpendicular to the plane where the base substrate is located and is parallel to the data line, and the second plane is perpendicular to the plane where the base substrate is located and is parallel to the gate line.

2. The array substrate according to claim 1, wherein a thickness of the bottom electrode for storage capacitance in a direction perpendicular to the base substrate is larger than a maximum value of a width of the bottom electrode for storage capacitance in the first direction.

3. The array substrate according to claim 2, wherein the thickness of the bottom electrode for storage capacitance in the direction perpendicular to the base substrate is equal to 2-4 times of the maximum value of the width of the bottom electrode for storage capacitance in the first direction; and
   the thickness of the bottom electrode for storage capacitance in the direction perpendicular to the base substrate is 1-5 microns.

4. The array substrate according to claim 2, further comprising an insulation layer, wherein
   the insulation layer in the pixel unit comprises a concave structure;
   the concave portion of the pixel electrode comprises a first portion, which locates at a side of the concave structure away from the bottom electrode for storage capacitance, a second portion, which locates at a side of the concave structure closer to the bottom electrode for storage capacitance, and a third portion, which at least partially overlaps the concave structure; and
   the first portion and the second portion locates at a side of the insulation layer away from the base substrate.

5. The array substrate according to claim 4, wherein the insulation layer is disposed between the base substrate and a plane where the first portion of the pixel electrode locates in the direction perpendicular to the base substrate.

6. The array substrate according to claim 1, further comprising a data line and a gate line, which are arranged on the base substrate and intersected with each other, wherein the first direction is parallel to an extension direction of the gate line or the data line.

7. The array substrate according to claim 6, wherein the first direction is parallel to the gate line; and
the pixel electrode and the bottom electrode for storage capacitance in the pixel unit are at least partially overlapped with each other in a second direction, wherein the second direction is parallel to the array substrate and is further parallel to the data line.

8. The array substrate according to claim 1, wherein an extension direction of the bottom electrode for storage capacitance is parallel to the base substrate, and the bottom electrode for storage capacitance is configured to surround a side surface, which is perpendicular to the base substrate, of the pixel electrode.

9. The array substrate according to claim 7, wherein the bottom electrode for storage capacitance comprises a first sub-electrode extending along the first direction and a second sub-electrode extending along the second direction.

10. The array substrate according to claim 9, wherein the bottom electrode for storage capacitance further comprises a connection sub-electrode for electrically connecting the first sub-electrode and the second sub-electrode.

11. The array substrate according to claim 1, wherein an orthographic projection of the bottom electrode for storage capacitance on a plane where the base substrate locates and an orthographic projection of the pixel electrode on the plane where the base substrate locates is not overlapped with each other.

12. A display panel, comprising the array substrate according to claim 1.

13. The display panel according to claim 12, further comprising:
an opposite substrate;
a black matrix, which is opposite to the bottom electrode for storage capacitance in the array substrate; and
a color filter, which is opposite to the pixel electrode in the array substrate;
wherein the black matrix and the color filter are disposed in the opposite substrate or the array substrate.

14. The display panel according to claim 13, wherein an orthographic projection of the bottom electrode for storage capacitance on the opposite substrate is within an orthographic projection of the black matrix on the opposite substrate.

15. A display device, comprising the array substrate according to claim 1.

16. A manufacturing method for an array substrate, comprising:
providing a base substrate;
forming an insulation layer and a bottom electrode for storage capacitance on the base substrate;
forming a concave structure for pixel electrode in the insulation layer with respect to the base substrate; and
forming a pixel electrode, wherein the pixel electrode comprises a concave portion that overlaps the concave structure for pixel electrode, the concave portion is on a side of the bottom electrode for storage capacitance, and the pixel electrode and the bottom electrode for storage capacitance are at least partially overlapped with each other through the concave portion of the pixel electrode in a first direction, and the first direction is parallel to the base substrate,
wherein an overlapping area of orthographic projections of the bottom electrode for storage capacitance and the pixel electrode on a first plane is a first overlapping area, and
an overlapping area of orthographic projections of the bottom electrode for storage capacitance and the pixel electrode on a second plane is a second overlapping area;
a sum of the first overlapping area and second overlapping area is larger than or equal to an overlapping area predetermine threshold; and
the first plane is perpendicular to the plane where the base substrate is located and is parallel to the data line, and the second plane is perpendicular to the plane where the base substrate is located and is parallel to the gate line.

17. The manufacturing method according to claim 16, wherein forming of the insulation layer and the bottom electrode for storage capacitance on the base substrate comprises:
forming a first insulation layer on the base substrate;
forming a concave structure for bottom electrode in the first insulation layer; and
forming the bottom electrode for storage capacitance in the concave structure for bottom electrode.

18. The manufacturing method according to claim 16, wherein after forming the bottom electrode for storage capacitance and before forming the concave structure for pixel electrode, the manufacturing method further comprises:
sequentially forming a protective layer and a second insulation layer on the bottom electrode for storage capacitance;
forming of the concave structure for pixel electrode in the insulation layer comprises:
forming the concave structure for pixel electrode in the first insulation layer, the protective layer and the second insulation layer.

19. A display panel, comprising an array substrate and a black matrix opposite to each other,
wherein the array substrate comprises: a base substrate and a pixel unit on the base substrate,
the pixel unit comprises a bottom electrode for storage capacitance and a pixel electrode, and the pixel electrode and the bottom electrode for storage capacitance are electrically insulated from each other so as to form a storage capacitor; and
the pixel electrode comprises a concave portion with respect to the base substrate, the concave portion is on a side of the bottom electrode for storage capacitance, the pixel electrode and the bottom electrode for storage capacitance in the pixel unit are at least partially overlapped with each other through the concave portion of the pixel electrode in a first direction so as to form the storage capacitor of the pixel unit, wherein the first direction is parallel to the base substrate;
an orthographic projection of the bottom electrode for storage capacitance on a layer where the black matrix is located is within the black matrix.

20. The display panel according to claim 19, wherein an extension direction of the bottom electrode for storage capacitance is parallel to the base substrate, and an inner edge of an orthographic projection of the bottom electrode for storage capacitance on the base substrate is configured to surround an orthographic projection of the pixel electrode on the base substrate.

\* \* \* \* \*